United States Patent
Bredin et al.

(10) Patent No.: US 6,807,552 B2
(45) Date of Patent: *Oct. 19, 2004

(54) PROGRAMMABLE NON-INTEGER FRACTIONAL DIVIDER

(75) Inventors: Francis Bredin, Maisons Alfort (FR); Bertrand Gabillard, Paris (FR)

(73) Assignee: International Business Machines Corporation, Armonk, NY (US)

( * ) Notice: Subject to any disclaimer, the term of this patent is extended or adjusted under 35 U.S.C. 154(b) by 609 days.

This patent is subject to a terminal disclaimer.

(21) Appl. No.: 09/935,400

(22) Filed: Aug. 23, 2001

(65) Prior Publication Data
US 2002/0116423 A1 Aug. 22, 2002

(30) Foreign Application Priority Data
Dec. 20, 2000 (EP) .............................. 00480127

(51) Int. Cl.⁷ .................... G06F 7/52; H03K 25/00
(52) U.S. Cl. .................... 708/103; 327/115; 377/48
(58) Field of Search ................ 708/103, 270, 708/271; 327/113–117; 377/47, 48

(56) References Cited

U.S. PATENT DOCUMENTS 6,157,694 A * 12/2000 Larsson .................. 377/48
6,356,123 B1 * 3/2002 Lee et al. ................. 327/115
6,441,655 B1 * 8/2002 Fallahi et al. ............ 327/115
6,501,336 B2 * 12/2002 Kim et al. ................. 331/10
6,748,408 B1 * 6/2004 Bredin et al. ............ 708/271

* cited by examiner

Primary Examiner—Chuong Dinh Ngo
(74) Attorney, Agent, or Firm—Robert M. Carwell

(57) ABSTRACT

A non-integer fractional divider is disclosed. According to the present invention, the non-integer fractional divider comprises means for dividing a reference clock signal having a period 'P' by a non-integer ratio 'K'. In a preferred embodiment, the divider comprises means for receiving a plurality 'N' of clock signals issued from the reference clock signal and wherein each clock signal is equally phase shifted by a 'P/N' delay one over the other. Selection means are coupled to the receiving means for selecting a first and a second clock signals between the plurality 'N' of clock signals. The selected clock signals are such that the phase shift delay between the two selected clock signals is representative of the non-integer value of the ratio 'K'. The selected clock signals are combined into combining means to generate a clock signal being phase shifted by the non-integer part of the non-integer ratio. Then, dividing means are coupled to the combining means for dividing the shifted clock signal by the integer part of the non-integer ratio.

11 Claims, 5 Drawing Sheets

PROGRAMMABLE NON-INTEGER FRACTIONAL DIVIDER

TECHNICAL FIELD

The present invention relates to dividers, and more particularly to a programmable non-integer fractional divider.

BACKGROUND ART

Phase-locked loops (PLLs) are used in a wide variety of applications in semiconductor devices. For example, PLLs are used in clock generators, frequency multipliers, frequency synthesizers, servo systems in disk drives and more recently in wireless networks. Naturally, in all of these and other applications the accuracy and reliability of the PLL is of critical importance.

A common phase-locked loop comprises a phase comparator, a charge pump, a filter, a voltage-controlled oscillator (VCO) and a feedback divider. The general operation of PLL's is well known, so only a brief explanation will be given. The phase comparator compares a reference input signal 'Fq' from a quartz to a feedback signal from the feedback divider. Depending upon the phase difference between the input signal and feedback signal, the phase comparator drives the charge pump. The output of the charge pump is filtered by the filter, and is used to drive the VCO. The VCO comprises a voltage-to-current converter and a current controlled oscillator. Thus, the VCO receives a voltage at its input and outputs a signal with a frequency proportional to that signal. Of course, those skilled in the art will recognize that this description of the VCO is essentially arbitrary and that the VCO could be illustrated as separate voltage-to-current converter and current-controlled oscillator rather than as a single element. The output of VCO fed back through feedback divider to phase comparator. The feedback divider divides down the VCO output signal frequency 'Fvco' to match the quartz input signal frequency 'Fq' so they can be phase compared.

The frequency at which the phase-locked loop operates is dependent upon the frequency of the VCO and the amount of division by the feedback divider. To change the VCO output frequency 'Fvco', these elements must be adjusted. Typically, the frequency at the input of the feedback divider 'Fvco' is divided by an integer ratio 'N' in the way that $$F_{out} = \frac{F_{vco}}{N},$$

where N is the integer value.

In some circuits, to improve the granularity of the system the quartz input signal frequency 'Fq' is also divided by an integer ratio 'B' before entering the phase comparator. The two frequencies at the input of the comparator are then related according to the formula:

$$\frac{F_{vco}}{N} = \frac{Fq}{B}$$

which may be rewritten as:

$$Fvco = Fq \times \frac{N}{B}$$

It is readily understood that a high granularity may be obtained by increasing the value of 'B'.

Unfortunately the higher the value of 'B' is, the lower the PLL bandwidth '$BW_{pll}$' is, according to the formula:

$$Bwpll = Fq \div 10 \times \frac{1}{B}$$

Therefore, with the known integer dividers, a tradeoff is to be found between granularity and PLL bandwidth values.

One obvious solution to have a high PLL bandwidth is to have a value of 'B' equal to '1', but in such case the granularity is limited to the value of Fq.

Non-integer values for 'N' are a solution for reducing the incremental performance granularity normally taken for integer ratios.

Such a prior art circuit for producing a non-integer ratio is disclosed in U.S. Pat. No. 4,891,774 from Bradley in which a dual modulus fractional divider having a dual modulus prescaler is coupled to a programmable divider. Latches and a full adder are provided for programming the programming divider with a modulus A, a modulus B, a modulus (A−1) and a modulus (B+1). A rate multiplier controls the adder to provide the desired resolution of the divider.

However, those existing circuits for producing non-integer ratios are limited to a few non-integer values.

Thus, the prior art PLL designs only allow the users to trade-off between 'a high granularity with a narrow bandwidth' or 'a wide bandwidth with a weak granularity'.

U.S. application Ser. No. 09/693057 from the assignee, discloses a programmable non-integer fractional divider which uses the 'N' internal phases of the VCO as inputs, and delivers an output 'Fdiv' whose frequency is a non integer sub-multiple of the VCO frequency 'Fvco'. This solution is well suited for an implementation based on a high level language description. Unfortunately, the use of a high level language to implement and synthesize the different logic blocks of this programmable non-integer fractional divider is not well suited when high frequency performance and high timing accuracy are required. This programmable non-integer fractional divider is able to operate at a maximum frequency of 300 MHz under worst case conditions of a 0.25 μm CMOS technology.

Moreover, this programmable fractional divider is designed to delivered a 50% duty cycle. This feature is obtained by the use of an 'even and odd' integer counter and an 'even and odd' non-integer incrementer.

However, in some PLL applications the need to get a divided frequency with a 50% duty cycle to feed the phase frequency detector (PFD) is not mandatory. Indeed, all the PFD's work on one edge (either the rising or the falling edge) and do not care of the opposite one (respectively the falling or rising one). Consequently, the PFD's do not required a 50% duty cycle.

Therefore, there exist a need to provide an improved PLL that can operate on a wide bandwidth while having a high granularity, and that can operate on various duty cycles.

SUMMARY OF THE INVENTION

The present invention solves the foregoing need by using a VCO generating a plurality of out-of-phase clock signals coupled to a non-integer fractional divider. According to the present invention, the fractional divider comprises means for dividing a reference clock signal 'Fvco' having a period 'P' by a non-integer ratio 'K'. In a preferred embodiment, the divider comprises means for receiving a plurality 'N' of clock signals 'Fvco_0 to Fvco_(n−1)' issued from the reference clock signal 'Fvco', and wherein each clock signal is equally phase shifted by a 'P/N' delay one over the other. Selection means are coupled to the receiving means for selecting a first and a second clock signals between the plurality 'N' of clock signals 'Fvco_0 to Fvco_(n−1)'. The selected clock signals are such that the phase shift delay between the two selected clock signals is representative of the non-integer value of the ratio 'K'. The selected clock signals are combined into combining means responsive to the receiving means to output a divided clock signal 'Fvco/K'. The appropriate selection of the first and second clock signals is repeated at each clock cycle according to a general formula wherein 'K' is the summation of an integer I, and a decimal X values:

$$K = I + X$$

The output duty cycle is equal to:

$$\text{Duty\_cycle} = \frac{1}{K}$$

In a preferred embodiment, the circuits are full custom design in order to get a very high frequency performance. As a result, in operation the fractional divider of the present invention exhibits a ×3 performance improvement compared to previous approach which means an operating frequency of 900 MHz under worst case conditions of a 0.25 μm CMOS technology.

In application, the invention is suitable to operate on a bandwidth range of hundred of MHz with a granularity of hundred of kHz.

The non-integer fractional divider of the present invention thus enables:

i) a drastically simplification of the overall design, and
ii) a drastically improvement of the maximum frequency of operation as compared to the prior art solutions by providing:
  a circuitry which reduces the total number of devices used; and
  a new state machine algorithm which simplifies the control logic circuit.

Preferably, the system of the invention is a non-integer fractional divider for dividing a reference clock signal 'Fvco' of period 'P' by a non-integer ratio 'K', the non-integer ratio being decomposed into an integer part 'I' and a non-integer part 'X'. The non-integer fractional divider comprising:

first and second receiving means for respectively receiving an identical plurality 'N' of clock signals 'Fvco_0 to Fvco_(N−1)', each clock signal having a period of 'P' and being equally phase shifted by a 'P/N' delay one over the other and wherein the first clock signal 'Fvco_0' being in phase with the reference clock signal;

means coupled to the first and second receiving means for selecting a first clock signal 'PHI1' from the first receiving means and a second clock signal 'PHI2' from the second receiving means;

means for detecting the end of a (I−i)th period, wherein 'i' is a predetermined value;

means coupled to the first and second receiving means and to the detection means for combining said first and second selected clock signals (PHI1, PHI2) to generate a clock signal 'Clock' being phase shifted by the non-integer part value 'X' of the non-integer ratio; and means (205) coupled to the combining means (204) for dividing the shifted clock signal by the integer part 'I' of the non-integer ratio.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION OF THE INVENTION

Figure 1:
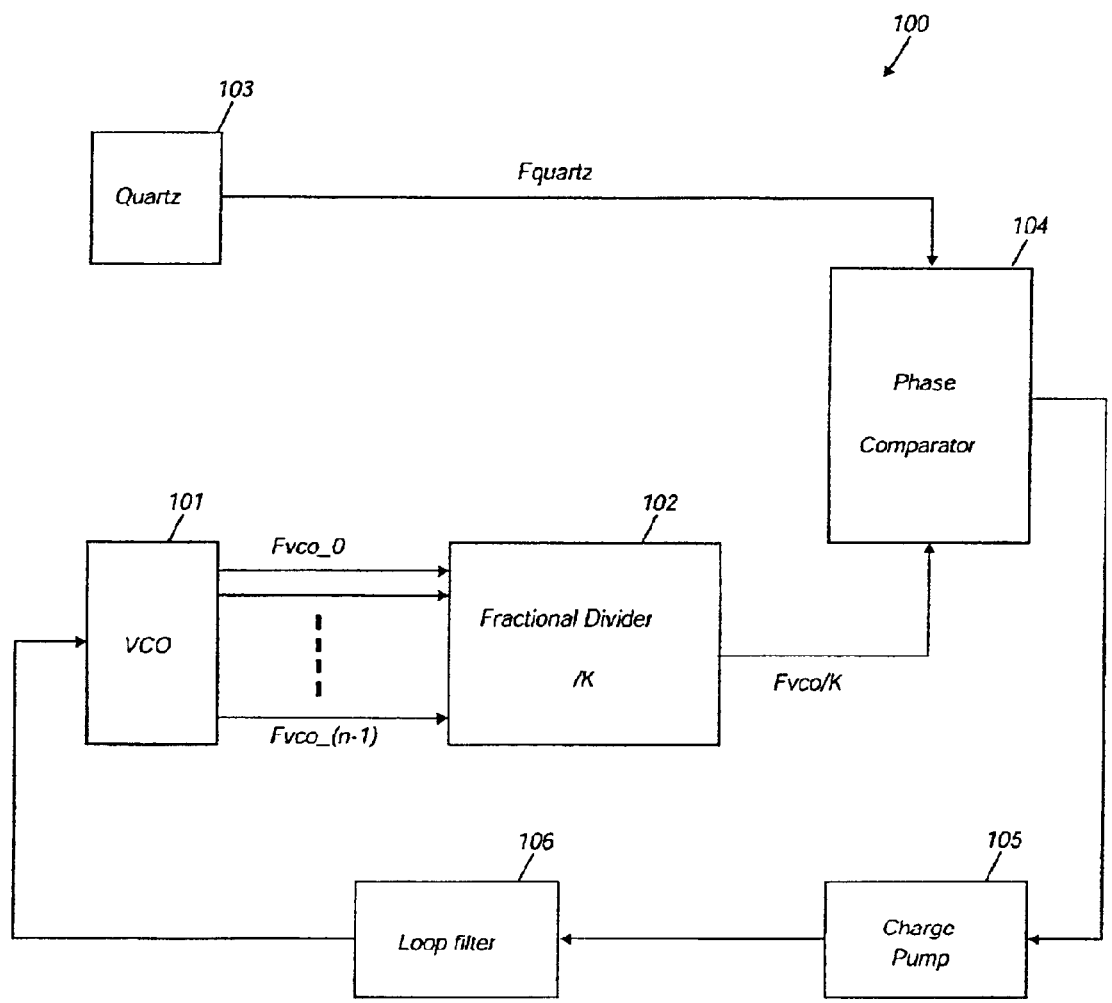
FIG. 1 is a block diagram of a PLL system including the fractional divider of the present invention.

Referring first to FIG. 1, there is illustrated a general representation of a PLL circuit 100 of the present invention. A VCO module 101 delivers N clocks signals denoted 'Fvco_0' to 'Fvco_(n−1)' to a fractional divider 102. The divide ratio of divider 102 is noted as 'K' wherein 'K' is a positive non-integer value. The frequency of the signal at the output of the fractional divider 102 is 'Fvco/K', and the resolution of the PLL is 'Fquartz/N'.

A quartz module 103 delivers to a first input of a phase comparator 104 a reference quartz signal having a 'Fquartz' frequency. A second input of the phase comparator 104 is connected to the output of the fractional divider 102 to receive the divided frequency 'Fvco/K'. The phase comparator 104 compares the two frequencies 'Fquartz' and 'Fvco/K'.

A charge pump 105 is connected to the output of the phase comparator 104, and a loop filter 106 is connected between the charge pump 105 and the multiple outputs VCO 101 to adjust its frequency accurately.

The VCO circuit 101 providing multiple outputs may be implemented by means of a chain of standard inverters which delay the input signal of the VCO by a constant interval. In a preferred implementation, the phase shift between two successive outputs of the VCO is equal to '0.125×P' while the number N of output clocks is 8 and P is the VCO period.

Figure 2:
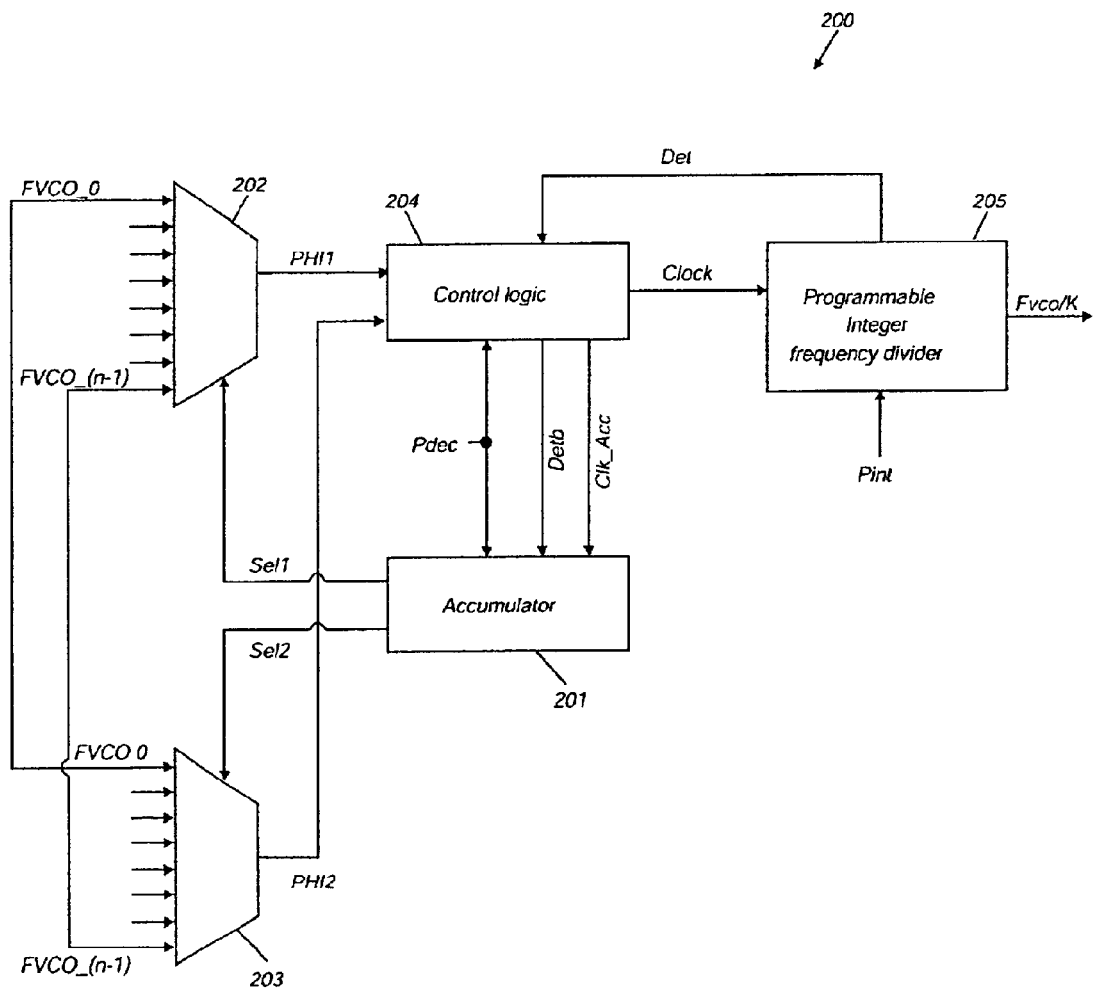
FIG. 2 is a preferred implementation of the fractional divider of the present invention.

FIG. 2 shows a diagram setting out full details of the fractional divider 200 of the present invention. The fractional divider 200 comprises an accumulator logic 201, a first clock multiplexer 202, a second clock multiplexer 203, a control logic block 204, and a programmable integer frequency divider 205. This integer frequency divider has a fixed duty cycle equal to 1/I, where I is the division rank fixed by a programming integer bit (Pint). The integer frequency divider also comprises means denoted by an output signal (Det) to detect previous periods such as the (I−2)th period.

As previously described, the VCO module delivers a plurality 'N' of VCO clocks signals denoted 'Fvco_0' to 'Fvco_(n−1)', each clock signal having a period of 'P' and being phase-shifted over the previous one by a time period equal to 'P/N'. Each VCO clock signal is connected to one input of both multiplexers (202, 203), hence each multiplexer inputs the same number 'N' of VCO clock signals.

To better understand the operation of the non-integer divider, one lets consider that the divide ratio of divider 200 which is noted 'K' may be rewritten as being the sum of two values 'I' and 'X' according to the following equation:

$$K = I + X \quad (1),$$

wherein 'I' represents the integer part of 'K', whereas 'X' represents the non integer part of K. As already explained, the minimum phase shift between 2 VCO output clocks is P/N, and the granularity is 1/N. Consequently 'X' is proportional to 1/N and 'K' can be rewritten as:

$$K = \left[ I + \left( \frac{1}{N} \times V \right) \right] \quad (2)$$

To exemplify if one let's desired a divider ratio of K=5.25 with a granularity of 1/N=0.125. According to equation (1), K is decomposed into the integer part I=5 and the non-integer part X=0.25. Then by application of equation (2) one obtains: X=1/N×V=0.25 with N being equal to 8 which leads to V=2. So for such example, the number of clocks signals to be output from the VCO module is N=8 (so Fvco_0 to Fvco_7). The phase shift between two successive outputs is given by 'V' which represents the index difference of two VCO clock signals successively used. Thus to divide by 5.25, the VCO clock signals 'Fvco_0', 'Fvco_2', 'Fvco_4' and 'Fvco_6' are used. Each selected VCO clock signal is applied to the divider during (I−1) VCO clock periods. Thus, the active edge of 'Fvco_0' is applied 4 times to the divider, next the active edge of 'Fvco_2' is also applied 4 times, and similarly for 'Fvco_4' and 'Fvco_6'.

Generally speaking, referring again to FIG. 2, the integer frequency divider (205) counts (I−1) VCO periods one after each other, (I−1) being a predetermined integer value stored through the programmable bit 'Pint' within the integer frequency divider. The integer frequency divider is clocked by the output clock signal (Clock) of control logic block (204). The active output of each multiplexer (PHI1, PHI2) is respectively determined by the two selection signals (Sel1, Sel2) issued from accumulator logic (201). Accumulator logic 201 delivers to each multiplexer a sequence of successive addresses to allow the selection of the appropriate VCO clock signals exhibited by the two multiplexer outputs PHI1 and PHI2. The integer frequency divider 205 further provides an end-of-period detection signal (Det) to control logic block 204 to indicate the end of the (I−2)th period. Control logic block must then inhibit the output clock signal (Clock) during a standby time period to detect a sequence of successive rising and falling edges of both signals PHI1 and PHI2 in order to be reactivated after this standby time period. When reactivated the clock signal is phase-shifted by the non-integer part of the non-integer ratio.

The divider of the present invention can be designed only using high level logic circuitry description such as the well-known VHDL tool, but for very high frequency performance, a full custom design is preferably used.

Figure 3:
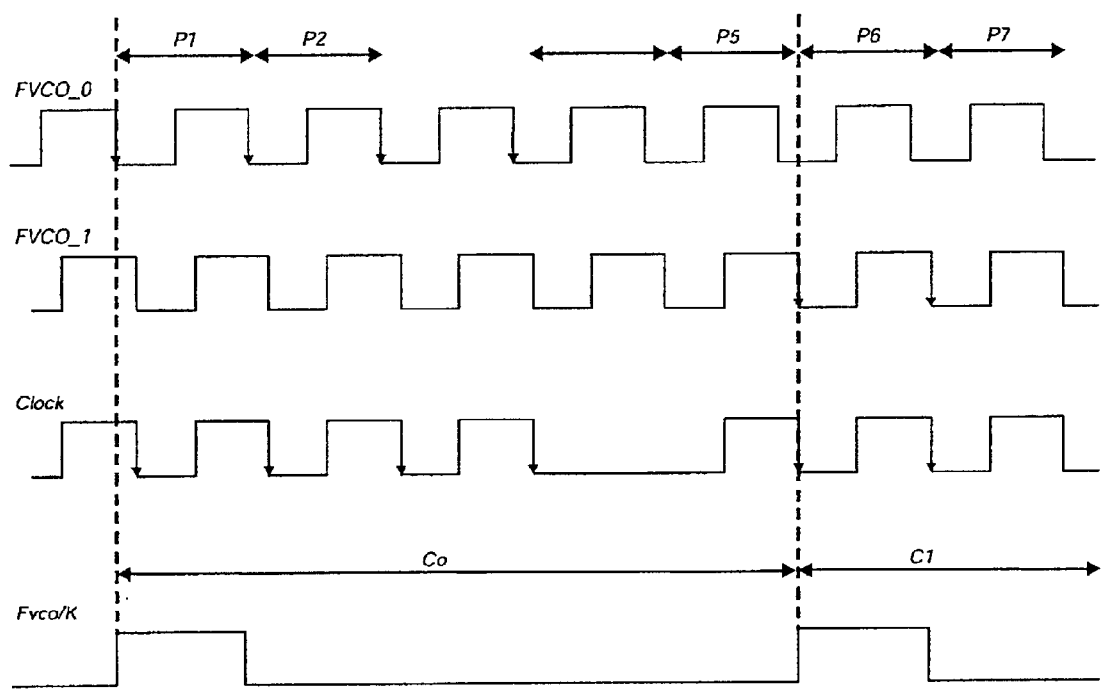
FIG. 3 illustrates a timing diagram of the operation of the fractional divider of the present invention.

Referring now to FIG. 3, a timing diagram of the operation of the fractional divider of the present invention is illustrated for a second example where the division ratio is K=5.125 with a granularity of 0.125. As previously explained, 'K' is decomposed into I=5 and X=0.125 which leads to V=1. Thus, eight VCO clock signals having a period of 'P' are provided to the multiplexers, each clock signals being equally phase shifted by P×⅛. In this example, the integer divider is active on the falling edge of the clock signal (Clock), but active edge could be applied without departing from the principals of the invention. On the first and second lines, the Vco clock signals 'Fvco_0' and 'Fvco_1' are shown during seven successive equal periods (P1 to P7). On the third line, the output clock signal (Clock) of control logic block 204 is shown. Clock signal (Clock) is initially in phase with signal 'FVco_0' and increments the internal counters of the integer frequency divider. Clock signal is forced by control logic block to an inactive mode represented by a low level after the detection of the (I−2)th period, i.e. the third period. When reactivated later the clock signal becomes in phase with clock signal 'Fvco_1'.

Preferably, the integer divider 205 detects the (I−2)th period in order to relax some internal timing constraints inside the control logic circuitry, but the detection could be based on another period such as the (I−1)th one. As a result the control logic can work faster and a higher frequency of operation is insured for the fractional divider.

On the fourth line of FIG. 3, the output 'Fvco/K' of frequency divider 205 is shown. The period is equal to 'C0' and exhibits a positive pulse whose time width is equal to the VCO period 'P'. Consequently, the duty cycle is equal to 1/K.

Figure 4:
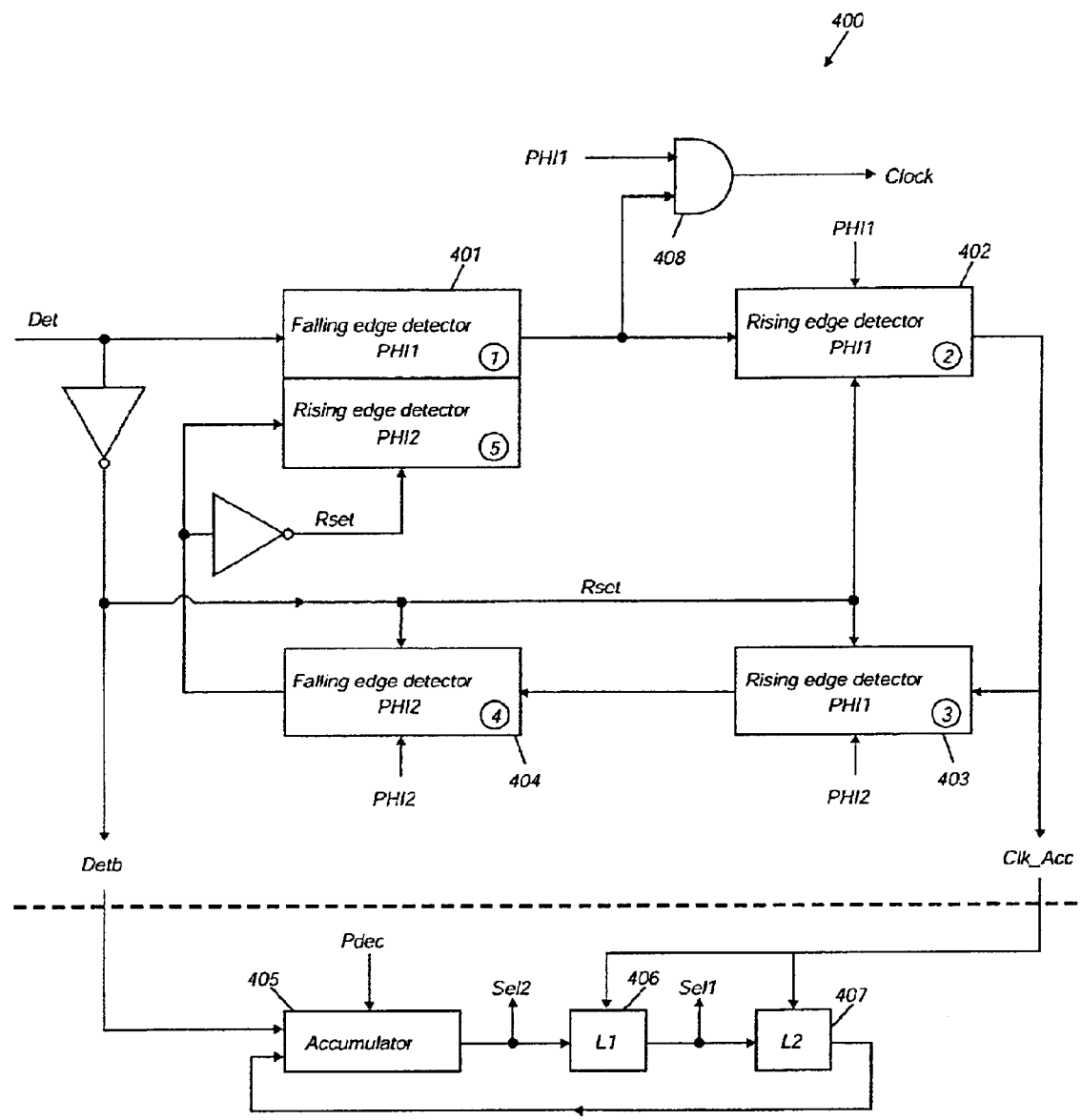
FIG. 4 is a detailed block diagram of the control logic circuit and the accumulator circuit of the present invention.

FIG. 4 shows a detailed block diagram 400 of control logic block 204 and of accumulator circuit 201. Control logic circuit 204 mainly consists of four block circuits 401, 402, 403 and 404.

General circuit 400 behaves like a state machine where block circuit 401 is set by detection signal 'Det'. Detection signal is output from the programmable integer frequency divider circuit 205 to inhibit the control logic circuit during a predetermined time period. Other block circuits 402, 403 and 404 are successively set by the valid output of the respective preceding block circuit, i.e. circuit 402 is set by the output of circuit 401; circuit 403 is set by the output of circuit 402; and circuit 404 is set by the output of circuit 403.

Figure 5:
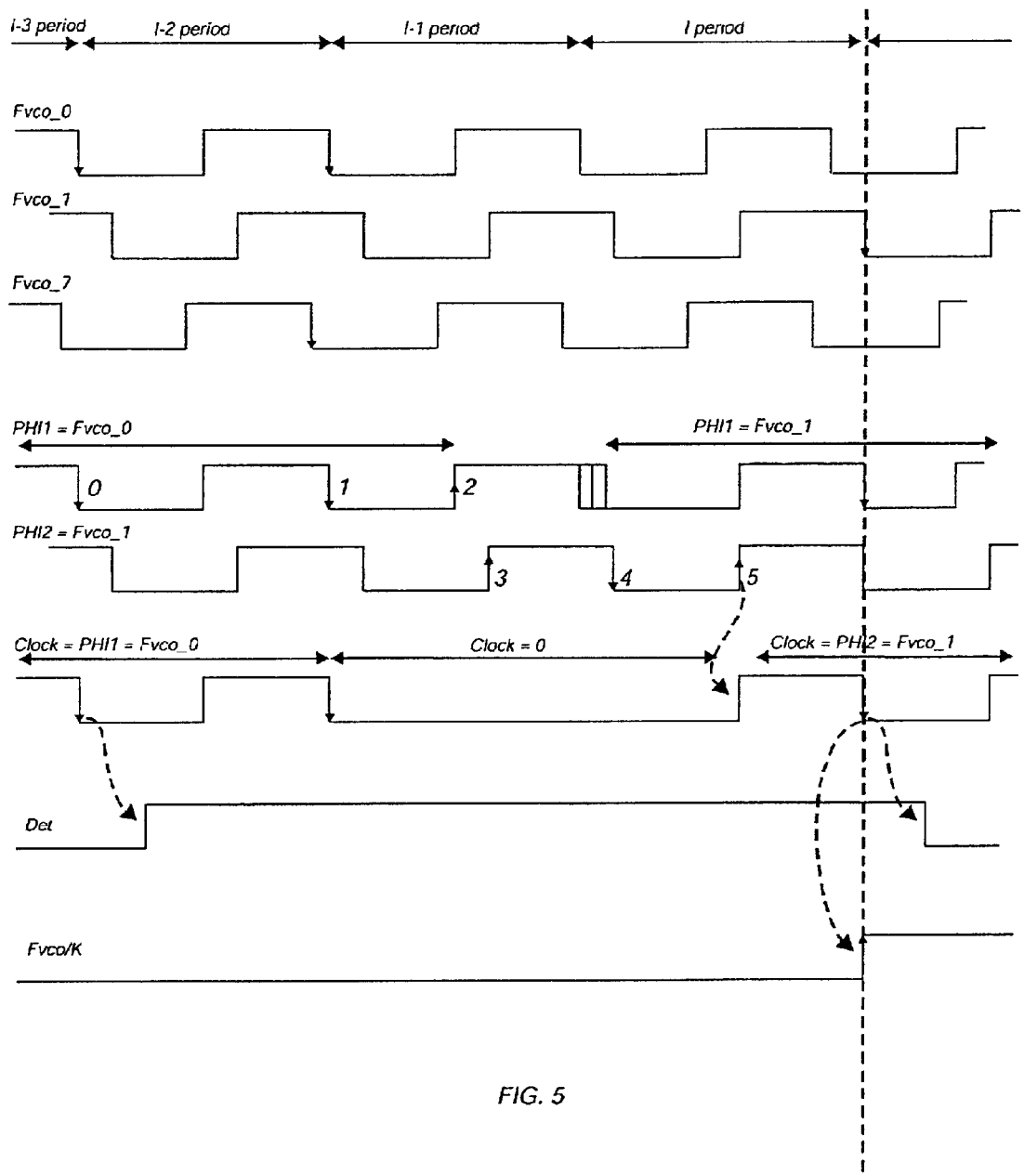
FIG. 5 illustrates the timing diagram of the control logic signals.

The 'Det' signal enters the edge detector circuit 401 which detects a falling edge of 'PHI1' signal (the falling edge detection is marked as '1' on FIG. 5). Next, the output of falling edge detector enters a second edge detector circuit 402 which also inputs the 'PHI1' signal to detect a rising edge of 'PHI1' signal (the rising edge detection is marked as '2' on FIG. 5). The output of circuit 402 is input to a third edge detector circuit 403 which also inputs the 'PHI2' signal to detect a rising edge of 'PHI2' signal (the rising edge detection is marked as '3' on FIG. 5). The output of circuit 403 is input to a fourth edge detector circuit 404 which also inputs the 'PHI2' signal to detect a falling edge of 'PHI2' signal (the falling edge detection is marked as '4' on FIG. 5). Finally, the output of falling edge detector 404 is input to circuit 401 which detects a rising edge of 'PHI2' signal. It is of a general knowledge of the skill man to implement the rising and falling edge circuits 401 to 404 with latching elements.

The output clock signal 'Clock' of control logic 204 is generated from a AND logic gate 408 which first follows the direct input of 'PHI1' and next is released until a rising edge detection of output signal 'PHI2' is detected within circuit 401 where the output clock signal follows the second multiplexer output signal 'PHI2'.

A reset signal is preferably applied to each block circuit (401 to 404) to reset the internal circuits at each end cycle. The reset signal of circuit 401 is preferably the inverted output of circuit 404, and the reset signal of circuits 402, 403, 404 is preferably the inverted output of detection signal 'Det' (both reset signals are denoted 'Rset' on FIG. 4).

Two output signals 'Detb' and 'Clock_acc' feed the accumulator logic 201.

Accumulator logic 201 is made of an accumulator circuit 405 connected to a first latching circuit 406, the output of first latch being the input of a second latching circuit 407. The accumulator circuit receives a bit configuration signal 'Pdec' to represent the decimal part of the division. The bit configuration lines are preferably set on 3-bits but more bits could be used as for example a 8-bits accumulator circuit to address a 256-inputs multiplexer. The output of accumulator circuit 405 is the selection signal 'Sel2' to be input to second multiplexer 203. Selection signal 'Sel2' is also input to first latch 406 which is clocked by clock signal (Clock_Acc) issued from circuit 402. First latching circuit 406 outputs selection signal 'Sel1' to be input to first multiplexer 202 and to the second latching circuit 407 which is also clocked by clock signal (Clock_Acc) issued from circuit 402. Finally, the output of second latch 407 is fed back to the accumulator circuit 405, which also inputs the reverse detection signal 'Detb'. A switch circuit (not shown) allows to activate the accumulator on the output signal of second latch 407 when the 'Detb' signal is reset.

When the clock signal (Clock_Acc) is active high and set after the detection of rising edge of PHI1 signal (event '2' on FIG. 5), the accumulator content is transferred to the first multiplexer 202 to increase the address selection. Consequently, the first multiplexer output exhibits the next frequency Vco signal 'Fvco_1' to later feed the integer divider.

In an alternate implementation, where the dividing ratio is an integer value, the bit configuration signal 'Pdec' is input to circuit 403 in order to inhibit the action of the output of circuit 402 over circuit 403.

FIG. 5 shows a detailed timing diagram of the control logic signals of circuit 204, again based on K being equal to 5.125. As previously said, K is decomposed into I=5 and X=0.125, and V is equal to 1. On the first and second lines, the Vc clock signals 'Fvco_0' and 'Fvco_1', having a period 'P' are shown during successive periods. The phase shift between these two clock signals is equal to P/8.

On the third line, the last VCO signal used 'Fvco_7' is also shown.

On the fourth line, the output 'PHI1' of first multiplexer is shown and is initially in phase with first VCO signal 'Fvco_0'. On the fifth line, the output 'PHI2' of second multiplexer is shown and is initially in phase with second VCO signal 'Fvco_1'.

On the sixth line, the control logic output clock signal (Clock) is shown. In the present example, the clock signal is active (Clock=PHI1) during a first time period P equal to the (I−2)th period, next is reset to low level (Clock=0) during a second time period equal to (1.5+X) (I−1)th period and finally reactivated (Clock=PHI2) during a third time period equal to half a period P.

Detection signal (Det) shown on the seventh line enables the control logic circuit to operate the detection of the successive rising and falling edges of PHI1 and PHI2 clocks, which are pointed out by references 1 to 5 on FIG. 5.

After detection of event pointed 5, the output clock signal 'clock' becomes in phase with 'PHI2' signal from second multiplexer which reproduces the 'Fvco_1' signal. The active edge of clock signal (which is taken as the falling edge in this example) allows to reset the detection signal 'Det' as well as the 'Clock-Acc' signal.

When the detection signal (Det) returns to the inactive level (the low level in the present example), the accumulator content is increased, and the new incremented address is provided to the second multiplexer.

The control logic block is then reset and ready to detect the (I−2)th period of 'Fvco_1' clock signal.

Although the present invention and its advantages have been described in detail and for preferred implementation, it should be understood that various changes, substitutions and alterations can be made herein without departing from the spirit and scope of the invention as defined by the appended claims.

What is claimed is:

1. A non-integer fractional divider (200) for dividing a reference clock signal 'Fvco' of period 'P' by a non-integer ratio 'K', the non-integer ratio being decomposed into an integer part 'I' and a non-integer part 'X', the non-integer fractional divider comprising:

first and second receiving means (202, 203) for respectively receiving an identical plurality 'N' of clock signals 'Fvco_0 to Fvco_(N−1)', each clock signal having a period of 'P' and being equally phase shifted by a 'P/N' delay one over the other and wherein the first clock signal 'Fvco_0' being in phase with the reference clock signal;

means (201) coupled to the first and second receiving means (202, 203) for selecting a first clock signal 'PHI1' from the first receiving means and a second clock signal 'PHI2' from the second receiving means;

means (205) for detecting the end of a (I−i)th period, wherein 'i' is a predetermined value;

means (204) coupled to the first and second receiving means (202, 203) and to the detection means (205) for combining said first and second selected clock signals (PHI1, PHI2) to generate a clock signal 'Clock' being phase shifted by the non-integer part value 'X' of the non-integer ratio; and means (205) coupled to the combining means (204) for dividing the shifted clock signal by the integer part 'I' of the non-integer ratio.

2. The non-integer fractional divider of claim 1 wherein the first and second receiving means respectively comprise a first multiplexer to receive the plurality 'N' of clock signals 'Fvco_0' to Fvco_(N−1)' and to output the first selected clock signal 'PHI1' in response to the selection means and a second multiplexer to receive the duplicate set 'Fvco_0 to Fvco_(N−1)' of the plurality 'N' of clock signals and to output the second selected clock signal 'PHI2' in response to the selection means.

3. The non-integer fractional divider of claim 1 wherein the selection means (201) comprises an accumulator circuit (405) to generate address selection signals (Sel1, Sel2).

4. The non-integer fractional divider of claim 1 wherein the dividing means (205) further comprising means for storing the integer value 'I' of the non-integer ratio 'K'.

5. The non-integer fractional divider of anyone of claim 1 wherein the predetermined value 'i' for detecting the end of a (I−i)th period is equal to 2.

6. The non-integer fractional divider of anyone of claim 1 wherein the selection means (201) further comprising means for storing the non-integer value 'X' of the non-integer ratio 'K'.

7. The non-integer fractional divider of anyone of claim 1 wherein the shifted clock signal 'Clock' is active during a first time period equal to the (I−2)th period and inactive during a second time period equal to (1.5+X) of the (I−1)th period and active during a third time period equal to half the Ith period.

8. The non-integer fractional divider of anyone of claim 1 further comprising means (101) for dividing the reference clock signal 'Fvco' into a plurality of equally phase-shifted clock signals 'Fvco-0 to Fvco-(N−1)'.

9. The non-integer fractional divider of anyone of claim 1 wherein the combining means (204) comprises means (401, 402, 403, 404) for detecting rising or falling edges of the selected clock signals (PHI1, PHI2).

10. A Phase Lock Loop circuit comprising the non-integer fractional divider of anyone of claim 1.

11. A non-integer fractional dividing method for dividing a reference clock signal 'Fvco' of period 'P' by a non-integer ratio 'K', the non-integer ratio being decomposed into an integer part 'I' and a non-integer part 'X', the method comprising:

receiving an identical plurality 'N' of clock signals 'Fvco_0 to Fvco_(N−1)', each clock signal having a period of 'P' and being equally phase shifted by a 'P/N' delay one over the other and wherein the first clock signal 'Fvco_0' being in phase with the reference clock signal;

selecting a first clock signal 'PHI1' and a second clock signal 'PHI2' from the plurality 'N' of clock signals;

detecting the end of a (I−i) th period, wherein 'i' is a predetermined value;

combining said first and second selected clock signals (PHI1, PHI2) to generate a clock signal 'Clock' being phase shifted by the non-integer part value 'X' of the non-integer ratio; and dividing the shifted clock signal by the integer part 'I' of the non-integer ratio.

* * * * *